United States Patent [19]
Yoon

[11] Patent Number: 5,975,742
[45] Date of Patent: Nov. 2, 1999

[54] ELECTRONIC PART INSERTING APPARATUS WITH CHECKING FUNCTION FOR CLINCHED STATE, AND CHECKING METHOD THEREOF

[75] Inventor: Yong-Ki Yoon, Taeku, Rep. of Korea

[73] Assignee: Daewoo Electronics Co., Ltd., Seoul, Rep. of Korea

[21] Appl. No.: 08/980,229

[22] Filed: Nov. 28, 1997

[30] Foreign Application Priority Data

Nov. 27, 1996 [KR] Rep. of Korea .................. 96-58066

[51] Int. Cl.⁶ .................................................. G06F 19/00
[52] U.S. Cl. .................................. 364/468.28; 29/838
[58] Field of Search ....................... 364/468.28; 29/837, 29/842, 739, 740, 838

[56] References Cited

U.S. PATENT DOCUMENTS

| | | |
|---|---|---|
| 4,286,379 | 9/1981 | Kawa et al. . |
| 4,549,087 | 10/1985 | Duncen et al. . |
| 4,601,032 | 7/1986 | Robinson . |
| 4,914,513 | 4/1990 | Spigarelli et al. . |
| 4,953,100 | 8/1990 | Yotsuya et al. ............... 382/147 |
| 4,964,211 | 10/1990 | Arao et al. . |
| 5,107,497 | 4/1992 | Lirov et al. . |
| 5,165,165 | 11/1992 | Aoki et al. ..................... 29/838 |

*Primary Examiner*—William Grant
*Assistant Examiner*—Chad Rapp
*Attorney, Agent, or Firm*—Jacobson, Price, Holman & Stern, PLLC

[57] ABSTRACT

In an electronic part inserting apparatus with a checking function for a clinched state, a database for clinch-checking is generated by extracting information for clinch-checking having coordinates of holes of each part to be inserted and a size and a shape of a corresponding land to the part from BOM data and CAD data. One part is selected from the database for clinch-checking. X, Y coordinates and a size of a land of the holes of the part are extracted. A corresponding hole position on a printed circuit board to the X, Y coordinates extracted from the database is found. A line length of the clinched lead is compared with the size of the land. If the line length of the clinched lead is larger than the size of the land, the clinched state of the hole is judged to be bad, but if not larger, the clinched state of the hole is judged to be good. A judged result is displayed on a monitor.

3 Claims, 4 Drawing Sheets

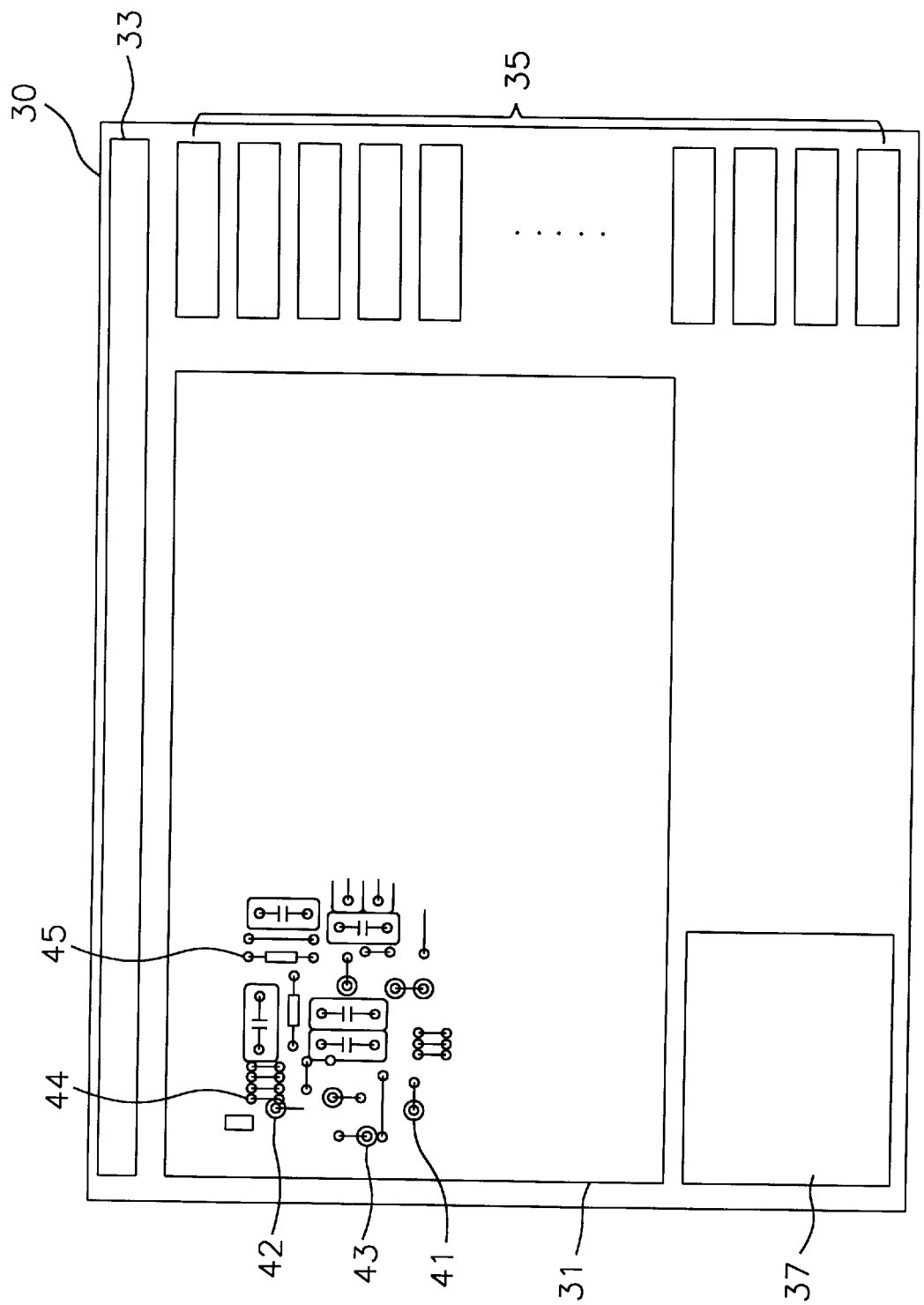

ELECTRONIC PART INSERTING APPARATUS WITH CHECKING FUNCTION FOR CLINCHED STATE, AND CHECKING METHOD THEREOF

BACKGROUND OF THE INVENTION

1. Field of the Invention

The present invention relates to an electronic part inserting apparatus with a checking function for a clinched state, and checking method thereof. More particularly, the present invention relates to an electronic part inserting apparatus with a checking function for a clinched state of lead line of the inserted part during automatically inserting the electronic part on a printed circuit board (PCB), and checking method thereof.

2. Prior Art

A technique of inserting electronic parts on the PCB was automatized a long time ago and has generally has been used ever since.

An operation of the automatic inserting apparatus is as follows.

1) An initial electrical circuitry diagram is produced.
2) A pattern of a printed board is manufactured on the basis of the circuitry diagram.
3) The printed board is manufactured by using the pattern of a printed board.
4) A part list database with respect to respective parts to be inserted on the printed board is prepared.
5) The information with respect to inserting positions and inserting orientations is read out by using the pattern of the printed board, and the information is then transformed into numerical control (NC) data corresponding to equipment for inserting the corresponding parts.
6) The NC data are inputted to the automatic inserting device, and desired parts are supplied and lead lines of the parts are inserted into the appropriate holes on the printed board.
7) A clinching process that the lead line after the inserting process is cut off to have an appropriate length to be bent and thereby the part is fixed is carried out.
8) An automatic soldering apparatus solders the respective parts at the printed board on which the inserting process and the clinching process are carried out so that a printed circuit board is completed.

In steps 7) and 8), when there is something wrong in—clinching process for fixing the part by cutting and bending the lead line which is inserted into the appropriate hole on the printed circuit board—, the respective parts can not be electrically connected as desired in layout. For example, when a line length of the clinched lead is larger than a range of a predetermined land of the hole, a short circuit with the neighboring lead line in the brazing process tends to occur. Also, when the inserted lead is imperfectly bent, imperfect brazing tends to occur. Therefore, productivity deteriorates due to bad PCBs with non-desired electrical connections.

SUMMARY OF THE INVENTION

In view of the foregoing, it is a first object of the present invention to provide an electronic part inserting apparatus with a checking function for a clinched state of lead line of the inserted part during automatically inserting the electronic part on a printed circuit board (PCB).

It is a second object of the present invention to provide a checking method of an electronic part inserting apparatus with a checking function for a clinched state of lead line of the inserted part during automatically inserting the electronic part on a printed circuit board (PCB).

To achieve the first object, the present invention provides an electronic part inserting apparatus comprising:

- a scanner for reading an image of a printed circuit board to transform the image to digital imaging data;
- an inputting section for inputting data or the commands;
- a database for clinch-checking formed by extracting information having coordinates of holes of a respective part to be inserted and a size and a shape of a corresponding land to the part from BOM (bill of materials) data and CAD data;
- clinch-checking means for checking clinch states of holes of the part on the printed circuit board, and for judging whether the clinched state is good or bad; and
- a monitor for displaying a part arrangement plan formed using the CAD data, and for displaying judged results for the clinched state of the holes of the respective parts.

In order to achieve the second object, the present invention provides a checking method of an electronic part inserting apparatus with a checking function for a clinched state comprising the steps of:

1) generating a database for clinch-checking by extracting information for clinch-checking having coordinates of holes of each part to be inserted and a size and a shape of a corresponding land to the part from BOM data and CAD data;
2) selecting one part from the database for clinch-checking, and finding a part number of the part;
3) searching the database for the selected part, extracting X, Y coordinates of the holes into which the part is to be inserted, and extracting a size of a corresponding land to the part;
4) finding a corresponding hole position on a printed circuit board to the X, Y coordinates of the hole extracted from the database;
5) comparing a line length of the clinched lead in the hole on the printed circuit board with the size of the land of the hole extracted from the database;
6) if the line length of the clinched lead is larger than the size of the land, then judging the clinched state of the hole to be bad, but if the line length of the clinched lead is not larger than the size of the land, then judging the clinched state of the hole to be good; and
7) displaying a judged result on a monitor, and storing it in a memory.

According to the present invention, it is provided with a electronic part inserting apparatus with the function capable of automatically checking for clinched state of lead line of the electronic part by using the database for clinch-checking and computer. Therefore, production of the printed circuit board of which electrical connections are bad is prevented, and thereby productivity is elevated.

BRIEF DESCRIPTION OF THE DRAWINGS

The above objects and other advantages of the present invention will become more apparent by describing in detail preferred embodiments thereof with reference to the attached drawings in which:

FIG. 4 is a view for showing a screen in which a judged result for a clinched state of hole is displayed on a monitor in checking for clinched states of the respective parts by the electronic part inserting apparatus of FIG. 1.

DETAILED DESCRIPTION OF THE PREFERRED EMBODIMENTS

Hereinafter, an embodiment of the present invention will be described in detail with reference to the accompanying drawings.

Figure 1:
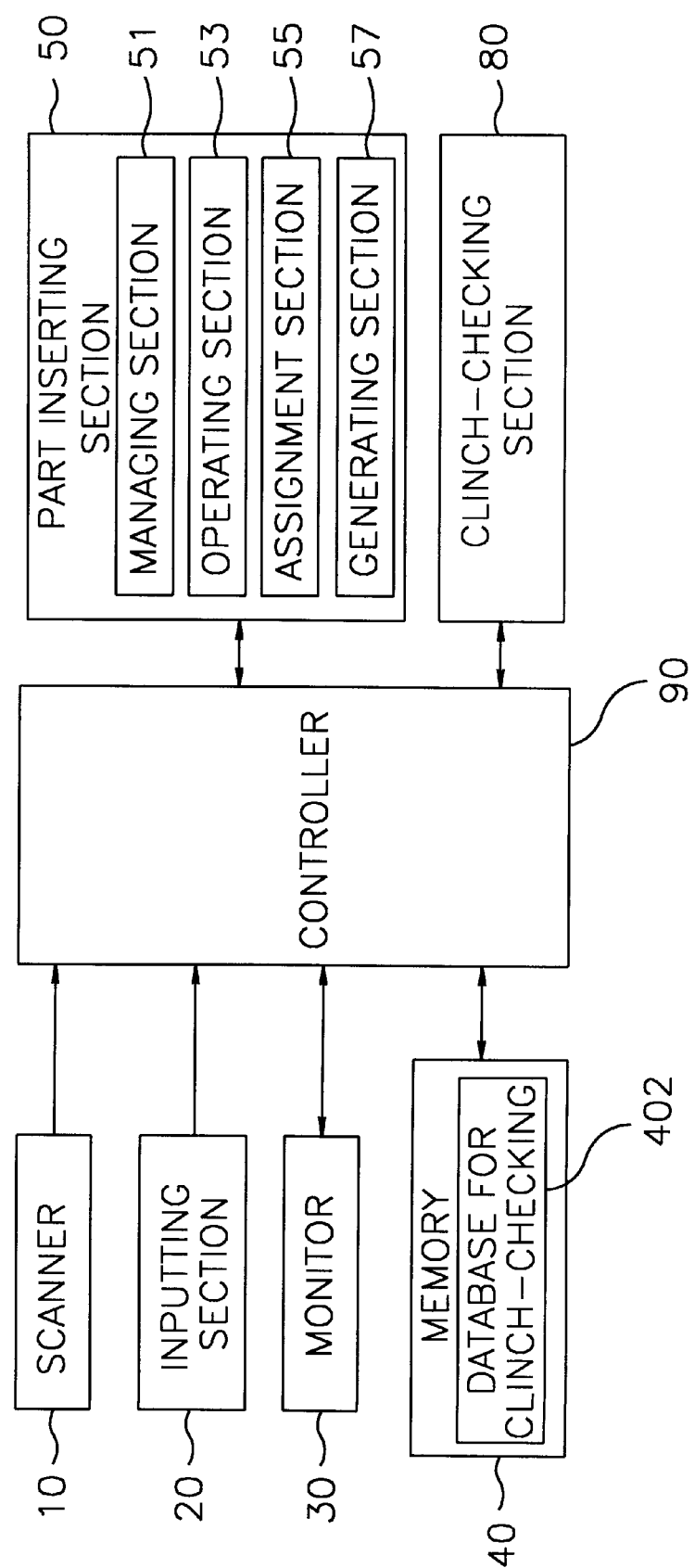
FIG. 1 is a schematic block diagram for showing a configuration of an electronic part inserting apparatus with a checking function for a clinched state according to an embodiment of the present invention.
Figure 2:
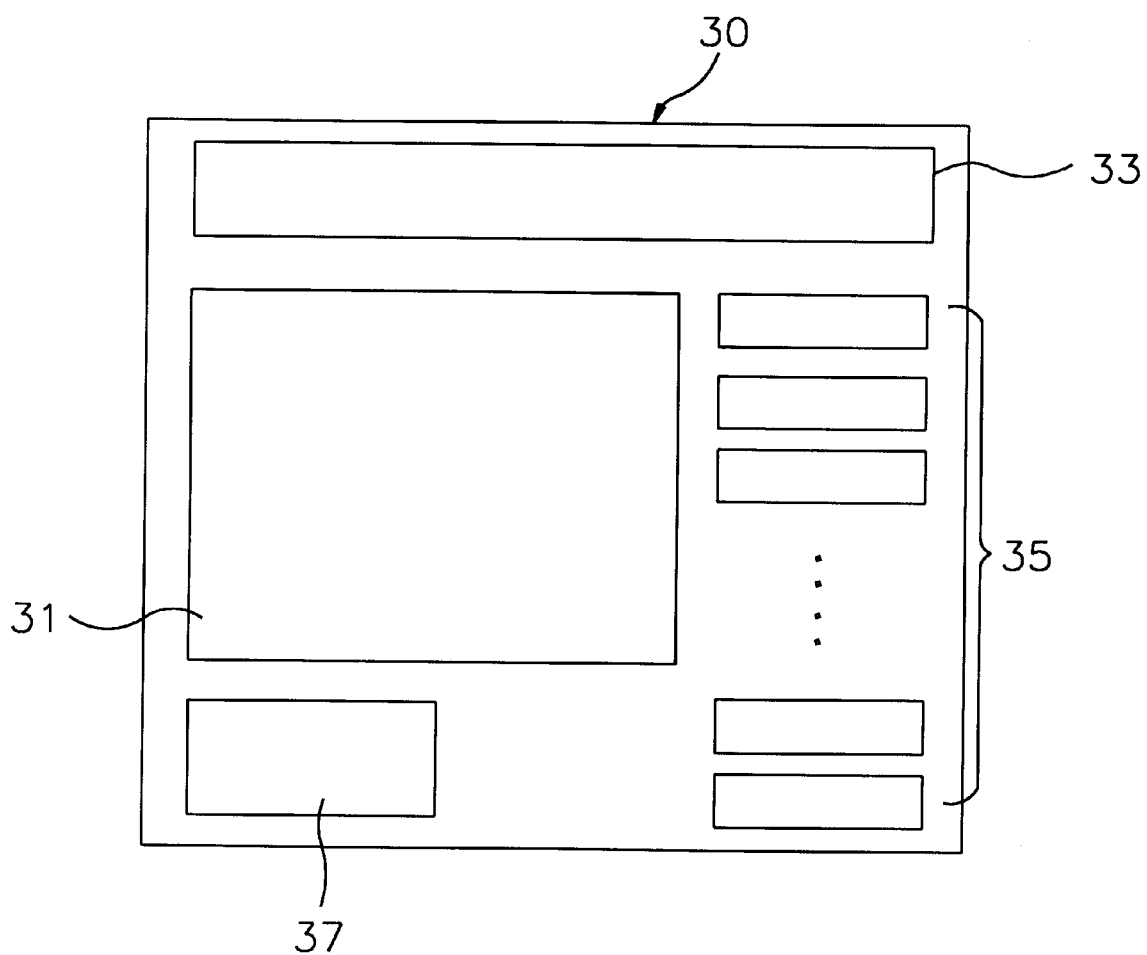
FIG. 2 is a view for showing a screen displayed on a monitor in checking for clinched states of the respective parts by the electronic part inserting apparatus of FIG. 1.

FIG. 1 is a schematic block diagram for showing a configuration of an electronic part inserting apparatus with a checking function for a clinched state according to an embodiment of the present invention. FIG. 2 is a view for showing a screen displayed on a monitor in checking for clinched states of the respective parts by the electronic part inserting apparatus of FIG. 1.

The electronic part inserting apparatus includes a scanner 10, an inputting section 20, a monitor 30, a memory 40, a part inserting section 50, a clinch-checking section 80, and a controller 90.

Scanner 10 serves to read an image of a printed circuit board to transform the image to digital imaging data.

Inputting section 20 provides a mouse and keyboard so that a worker can input the data or the commands, more particularly, the command for clinch-checking. Furthermore, if the worker wants to partially clinch-check only for some parts, it is possible for the worker to click the desired parts and thereby the clinch-checking process only for the clicked parts is carried out.

Monitor 30, as shown in FIG. 2, serves to display judged results for clinched states of holes of parts. Monitor 30 is provided with a part arrangement plan 31 on the center of the screen thereof, in which part arrangement plan 31 is formed using the CAD data. Also, Monitor 30 is provided with a title area 33 on the top side of the screen, a menu area 35 on the right side of the screen, in which menu area 35 has a plurality of menu keys, and a pattern plan 37 at the lower part on the screen, in which the pattern plan 37 is to display an electrical connection between the respective parts.

Memory 40 has BOM (bill of materials) data and CAD data. The BOM data are formed of model information of the electrical parts required in the process for inserting the electrical parts on the printed circuit board. The BOM data are model information having part numbers of respective parts to be inserted on the printed circuit board, part codes set to connect the corresponding parts with reel information, part names which indicate kinds of the corresponding parts, and part specifications of the corresponding parts. The CAD data are formed of arrangement information of the electrical parts for displacing the electrical parts at the appropriate positions.

Memory 40 also has a database for clinch-checking 402 formed by extracting information for clinch-checking having coordinates of holes of respective parts to be inserted and a size and a shape of a corresponding land to the part from BOM data and CAD data.

Part inserting section 50 serves to insert any one part into corresponding holes on PCB by means of appropriate equipment on the basis of commands and data such as the BOM data and CAD data. A data generating and managing section 51 of part inserting section 50 generates required databases from the BOM data and CAD data which are to be input by inputting section 20. An equipment operating section 53 of part inserting section 50 outputs data relating to coordinates and arranged angles of parts and order for inserting the respective parts. An equipment assignment section 55 of part inserting section 50 appropriately distributes the respective parts to corresponding equipment. A path generating section 57 generates and corrects paths for automatically inserting parts mounted at the appropriate equipment.

A clinch-checking means 80 serves to check clinched states of holes of the part on the printed circuit board and to judge whether the clinched state is good or bad on the basis of information which is extracted by a controller 90 from the database for clinch-checking 402, after the processes in which the parts are inserted into the corresponding holes by the appropriate equipment and the inserted lead is clinched. Furthermore, a clinch-checking means 80 outputs the judged result for the clinched state of the hole into monitor 30, and stores the result in memory 40.

Furthermore, the clinch-checking means 80 has a function to partially clinch-check only for one electronic part, in which the electronic part desired to be checked is input by the inputting section 20, and thereby the clinch-checking process only for the clicked part is carried out.

A controller 90 forms a database for clinch-checking 402 from BOM data and CAD data input by the inputting section 20, and stores the database for clinch-checking 402 in memory 40.

Hereinafter, a checking method of an electronic part inserting apparatus of the present invention will be described.

Figure 3:
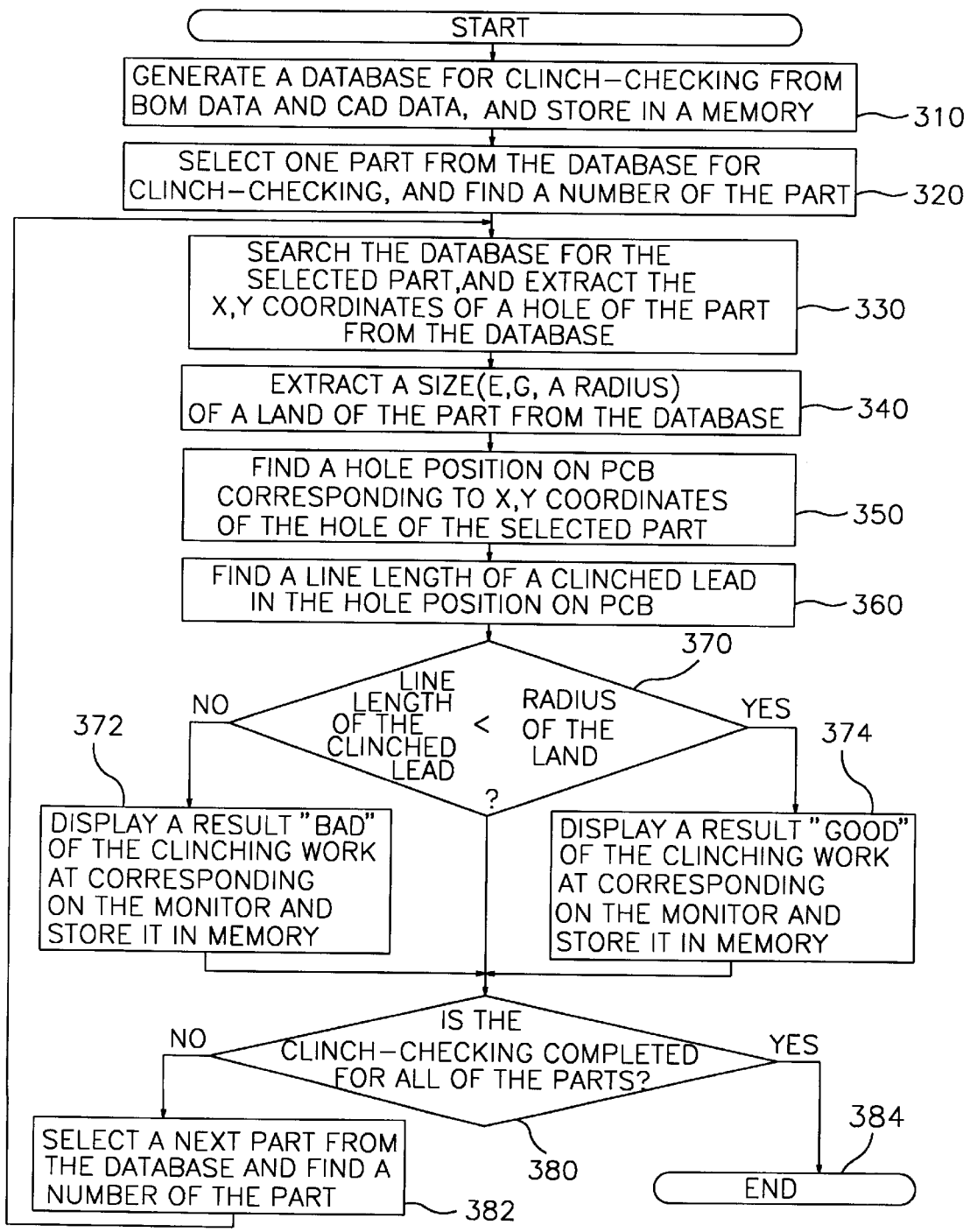
FIG. 3 is a flow chart for illustrating a checking method of the clinched state by the electronic part inserting apparatus of FIG. 1.

FIG. 3 is a flow chart for illustrating a checking method of the clinched state by the electronic part inserting apparatus of FIG. 1. FIG. 4 is a view for showing a screen in which a judged result for a clinched state of hole is displayed on a monitor in checking for clinched states of the respective parts by the electronic part inserting apparatus of FIG. 1.

In step 310, a database for clinch-checking 402 is formed by extracting information for clinch-checking having coordinates of holes of each part to be inserted and a size and a shape of a corresponding land to the part from BOM data and CAD data, and the database 402 is stored in memory 40.

In step 320, one electronic part is selected from the database for clinch-checking 402, and a part number of the part is found.

In step 330, the database is searched for selected part, and therefrom X, Y coordinates of the holes, into which the part is to be inserted, are extracted.

In step 340, the database is searched for selected part, and therefrom a size, more particularly a semidiameter, of a corresponding land to the part is extracted.

In step 350, a corresponding hole position on a printed circuit board to the X, Y coordinates of the hole extracted from the database is found.

In step 360, a line length of the clinched lead in the hole on the printed circuit board is found.

In step 370, the line length of the clinched lead in the hole on the printed circuit board is compared with the radius of the land of the hole extracted from the database.

In step 372, if the line length of the clinched lead is larger than the size of the land, then the clinched state of the hole is judged to be "bad" and stored in a memory. The judged result is displayed as on a monitor as shown in FIG. 4. For example, in FIG. 4, the clinched state of lands 41, 42, 43 . . . are judged to be "bad" and the lands 41, 42, 43 . . . are respectively marked with red circles.

In step 374, if the line length of the clinched lead is not larger than the size of the land, the clinched state of the hole is judged to be "good", and the judged result is displayed on a monitor and stored in a memory. In FIG. 4, the clinched state of lands 44, 45 . . . are judged to be "good" and the lands have no marks.

In step 380, whether the clinch-checking judgement has been carried out for all of the electronic parts is checked.

In step 382, if the clinch-checking judgement has not been carried out for all of the electronic parts, a next electronic part is selected from the database for clinch-checking 402, and a part number of the part is found, and returned to the step 330.

In step 384, if the clinch-checking judgement has been carried out for all of the electronic parts, the checking process of clinched state ends.

Furthermore, the clinch-checking means has a function to partially clinch-check for one parts, in which an electronic part desired to be checked is input by clicking the mouse, and thereby the clinch-checking process only for the clicked electronic part is carried out.

According to the present invention, an electronic part inserting apparatus with the function capable of automatically checking for clinched state of lead line of the electronic part by using the database for clinch-checking and computer is provided. Therefore, production of the printed circuit board of which electrical connections are bad is prevented, and thereby productivity is elevated.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A checking method of an electronic part inserting apparatus with a checking function for a clinched state comprising the steps of:
   1) generating a database for clinch-checking by extracting information for clinch-checking having coordinates of holes of each part to be inserted and a size and a shape of a corresponding land to the part from BOM data and CAD data;
   2) selecting one part from the database for clinch-checking, and finding a part number of the part;
   3) searching the database for the selected part, extracting X, Y coordinates of the holes into which the part is to be inserted, and extracting a size of a corresponding land to the part;
   4) finding a corresponding hole position on a printed circuit board to the X, Y coordinates of the hole extracted from the database;
   5) comparing a line length of the clinched lead in the hole on the printed circuit board with the size of the land of the hole extracted from the database;
   6) if the line length of the clinched lead is larger than the size of the land, then judging the clinched state of the hole to be bad, but if the line length of the clinched lead is not larger than the size of the land, then judging the clinched state of the hole to be good;
   7) displaying a judged result on a monitor, and storing it in a memory; and
   8) checking whether the clinch-checking judgement has been carried out for all of the electronic parts of the printed circuit board.

2. A checking method of an electronic part inserting apparatus with a checking function for a clinched state as claimed in claim 1, if the clinch-checking judgement has not been carried out for all of the electronic parts, a next electronic part is selected from the database for clinch-checking, and a part number of the part is found, and returned to the step (3).

3. A checking method of an electronic part inserting apparatus with a checking function to partially clinch-check for an electronic part of a printed circuit board comprising the steps of:
   1) generating a database for clinch-checking by extracting information for clinch-checking having coordinates of holes of each part to be inserted and a size and a shape of a corresponding land to the part from BOM data and CAD data;
   2) inputting an electronic part desired to be checked by the inputting section;
   3) finding a part number of the electronic parts desired to be checked from the database for clinch-checking;
   4) searching the database for selected part, extracting X, Y coordinates of the holes into which the part is to be inserted, and extracting a size of a corresponding land to the part;
   5) finding a corresponding hole position on a printed circuit board to the X, Y coordinates of the hole extracted from the database;
   6) comparing a line length of the clinched lead in the hole on the printed circuit board with the size of the land of the hole extracted from the database;
   7) if the line length of the clinched lead is larger than the size of the land, then judging the clinched state of the hole to be bad, but if the line length of the clinched lead is not larger than the size of the land, then judging the clinched state of the hole to be good; and
   8) displaying a judged result on a monitor, and storing it in a memory.

* * * * *